United States Patent [19]

Roche et al.

[11] Patent Number: 4,731,318

[45] Date of Patent: Mar. 15, 1988

[54] INTEGRATED CIRCUIT COMPRISING MOS TRANSISTORS HAVING ELECTRODES OF METALLIC SILICIDE AND A METHOD OF FABRICATION OF SAID CIRCUIT

[75] Inventors: Alain Roche, La Tronche; Joseph Borel, St. Egreve, both of France

[73] Assignee: Societe pour l'Etude et la Fabrication des Circuits Integres Speciaux - E.F.C.I.S., Grenoble, France

[21] Appl. No.: 831,851

[22] Filed: Feb. 24, 1986

[30] Foreign Application Priority Data

Feb. 26, 1985 [FR] France ................................. 85 02760

[51] Int. Cl.[4] .......................... G03C 5/00; G03C 5/04; H01L 21/00; B44C 1/22
[52] U.S. Cl. ....................................... 437/41; 430/396; 430/311; 156/659.1; 148/DIG. 19; 148/DIG. 147; 148/DIG. 152; 437/200
[58] Field of Search ................ 29/571; 148/DIG. 19, 148/DIG. 147, DIG. 152; 430/310, 311, 396; 156/659.1

[56] References Cited

U.S. PATENT DOCUMENTS

| | | | |
|---|---|---|---|
| 4,384,301 | 5/1983 | Tasch et al. | 430/311 |
| 4,505,027 | 3/1985 | Schwabe et al. | 29/577 C |
| 4,593,454 | 6/1986 | Baudrant et al. | 29/571 |

FOREIGN PATENT DOCUMENTS 0124954 11/1984 European Pat. Off. .

OTHER PUBLICATIONS

Refractory Silicides for Integrated Circuits, S. P. Murarka, J. Voc. Sci. Technol., 17(4), Jul./Aug. 1980, pp. 775-792.
IEEE Transactions on Electron Devices, vol. ED-31, No. 9, Sep. 1984, pp. 1329-1334, IEEE, New York, US; Hidekazu Okabayashi et al., "Low Resistance MOS Technology Using Self-Aligned Refractory Silicidation".
IBM Technical Disclosure Bulletin, vol. 25, No. 3B, Aug. 1982, pp. 1396, 1397, New York, US; H. J. Geipel et al.: "Process for Simultaneously Making Silicide Gate, Source and Drain Electrodes".

*Primary Examiner*—John E. Kittle
*Assistant Examiner*—Patrick J. Ryan
*Attorney, Agent, or Firm*—Oblon, Fisher, Spivak, McClelland, & Maier

[57] ABSTRACT

A novel MOS transistor structure comprises electrodes of metallic silicide and especially tantalum silicide. In the case of the gate electrode, the silicide is directly in contact with an insulating thin-film layer. In the case of the drain and source electrodes, the silicide is directly in contact with the monocrystalline silicon. The method of fabrication is thus simplified while avoiding the use of polycrystalline silicon.

3 Claims, 8 Drawing Figures

INTEGRATED CIRCUIT COMPRISING MOS TRANSISTORS HAVING ELECTRODES OF METALLIC SILICIDE AND A METHOD OF FABRICATION OF SAID CIRCUIT

BACKGROUND OF THE INVENTION

1. Field of the Invention

The present invention relates to MOS integrated circuits having high integration density.

2. Description of the Prior Art

Current trends are directed towards the fabrication of integrated circuits in which it is continually sought to achieve further reductions in size while at the same time incorporating the greatest possible number of elements. This entails the need to produce individual element structures which are as small as possible and to make use of integration technologies with self-alignment of the patterns which are formed successively on the circuit wafers.

In particular, one technique which has now found wide acceptance lies in the use of MOS transistor gates formed of doped polycrystalline silicon and etched prior to implantation of the source and drain regions of the transistors. The gate thus serves as a mask at the time of implantation. The source and the drain are therefore self-aligned with respect to the edges of the gate.

Polycrystalline silicon layers are also employed in the fabrication of source and drain electrodes in contact with the monocrystalline silicon of the substrate and for the formation of connections between transistors. Apart from the ability of doped polycrystalline silicon (of the same conductivity type as the source and the drain) to serve as a mask at the time of implantation of the source and drain regions, this material offers the advantage of establishing a good ohmic contact with the source and drain regions.

Unfortunately, even if polycrystalline silicon is heavily doped, its conductivity is relatively limited and consequently needs to be increased (since it serves to form conductive connections between elements). To this end, a layer of metallic silicide (platinum silicide, titanium silicide, tantalum silicide, for example) is formed on the top surface of the polycrystalline silicon.

This layer is formed by depositing a metallic layer above the polycrystalline silicon (by cathode sputtering from a target of the metal considered) and by annealing so as to form an alloy (silicide) with the superposed polycrystalline silicon. A silicide can also be deposited directly by cathode sputtering from a target of sintered metallic silicide. This depends on the metal considered.

SUMMARY OF THE INVENTION

The present invention proposes a method of fabrication of an integrated circuit comprising transistors in which polycrystalline silicon is not employed as constituent material of the transistor gates, thereby dispensing with the long and difficult steps of the fabrication process (especially deposition of polycrystalline silicon, doping and deoxidizing of the silicon after doping).

The integrated circuit comprises MOS transistors formed in a monocrystalline silicon substrate, the transistors being each provided with a source region, a drain region and a channel region which separates the source region from the drain region, as well as a source electrode, a drain electrode, and a gate electrode isolated from the channel region by an insulating thin film. The distinctive feature of the integrated circuit in accordance with the invention lies in the fact that the gate electrode is constituted by a portion of metallic silicide layer which is directly in contact with the insulating thin film, and the source and drain electrodes are constituted respectively by other portions of metallic silicide layer, said other portions being in direct contact with the monocrystalline silicon of the source and drain regions respectively.

The silicide is preferably a tantalum silicide but other silicides can also be employed.

The method of fabrication according to the invention, in which self-alignment of the channel region with respect to the gate is maintained, comprises the following successive steps:

(a) formation of an insulating thin film constituting the gate insulator of a field-effect transistor on a substrate of monocrystalline silicon of a first conductivity type in an active zone of said substrate;

(b) etching of the insulating layer with a view to baring the monocrystalline silicon in contact zones between source and drain regions and source and drain electrodes;

(c) uniform deposition of a metallic silicide over the entire substrate so that the silicide rests on the gate insulator at locations in which this latter is present and comes into direct contact with the monocrystalline silicon on the remainder of the active zone;

(d) deposition of a photosensitive layer which is capable of affording resistance to the silicide etching products and of serving as a mask for stopping impurities at the time of an operation involving implantation of impurities;

(e) photoetching of the photosensitive layer in order to form a resin pattern comprising a porton of resin above the gate insulator, said portion being intended to correspond to the pattern of the gate to be formed, and portions of resin defining a source electrode, a drain electrode and interconnections, the resin being removed along the edges of the gate above the active zone and permitted to remain above the silicide in portions of active zone in which the silicide is in contact with the monocrystalline silicon;

(e) etching of the silicide at locations in which it is not protected by the resin;

(g) ion implantation of impurities in order to define source and drain regions;

(h) removal of the resin;

(i) annealing of the substrate.

In order to complete the doping of the source and drain regions at locations in which the silicide is in contact with the monocrystalline silicon, it is possible either to carry out an implantation (with masking of the channel by a resin) prior to operation b or to perform an implantation (also masked by a resin) through the silicide after operation h.

The methods of fabrication thus obtained are more simple than those which make use of polycrystalline silicon.

The term "photosensitive resin" used in the following description will be understood to mean in particular the so-called multilayer resins which consist of several superposed layers of different materials and only the top layer of which is really a photosensitive resin.

BRIEF DESCRIPTION OF THE DRAWINGS

Other features of the invention will be more apparent upon consideration of the following description and accompanying drawings, wherein.

DETAILED DESCRIPTION OF THE INVENTION

Figure 1:
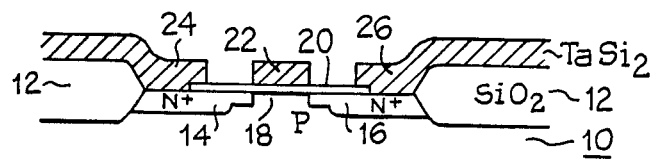
FIG. 1 illustrates the structure of an MOS transistor of a circuit fabricated by the method in accordance with the invention.

FIG. 1 is a cross-section showing an MOS transistor formed in a monocrystalline silicon substrate 10. The transistor could also be formed in a case of opposite conductivity type with respect to the substrate (especially for integrated circuits which utilize the CMOS technology). The substrate in this instance is p-type, for example.

The transistor is formed in an active zone surrounded by a wall 12 of thick silicon oxide. In accordance with conventional practice, steps can be taken to ensure that the p-type substrate is more heavily doped beneath the thick oxide than in the active zone. By way of example, the oxide thickness is 5000 Angströms.

A source region 14 heavily doped with an impurity of opposite conductivity type relative to the substrate and a drain region 16 doped in the same manner as the source region are formed on the surface of the substrate and are separated by a p-type channel region constituted by the substrate itself.

The channel region 18 is covered with a thin insulating layer 20 formed in principle of silicon oxide ($SiO_2$). The thickness is a few hundred Angströms or less.

Above the channel region is formed a conductive gate 22 which rests on the thin insulating layer 20.

The gate is self-aligned with respect to the channel region. In other words, the edges of the gate are located directly above the edges of the channel region and project to a very slight extent above the edges of the source and drain regions adjacent to the channel region.

A source electrode 24 comes into contact with a portion of the monocrystalline silicon surface of the source region 14 and may extend upwards over the thick oxide 12. Said electrode 24 is separated from the gate, with the result that there remains a portion of source region which is not covered with silicide.

Likewise a drain electrode 26 comes into contact with at least part of the monocrystalline silicon surface of the drain region and may extend upwards over the thick oxide 12. Said electrode 26 is also separated from the gate so as to leave a portion of drain region which is not covered with silicide.

The conductive gate 22 and the source and drain electrodes are formed by separate portions of one and the same metallic silicide layer which is directly in contact with the monocrystalline silicon in the source and drain regions and which is directly in contact with the gate insulator 20 above the channel.

Among the silicides which are open to choice, preference is given to tantalum silicide $TaSi_2$.

The silicide layer also serves to form interconnections, especially above the thick oxide walls.

In FIG. 1, the source and drain regions extend without discontinuity between the channel region and the thick oxide wall 12 which surrounds the active zone.

In FIG. 1, there are shown neither the insulating and passivating layers not the other layers of interconnections which can be provided on several levels in an integrated circuit.

The steps involved in fabrication of this structure are illustrated in the following figures. There will be described below only the essential steps corresponding to formation of the gate, source and drain electrodes. Other conventional steps can be carried out before or after the steps illustrated in the drawings (for example implantations of anti-inversion layers, enrichment or depletion implantations, and so on).

Figure 2:
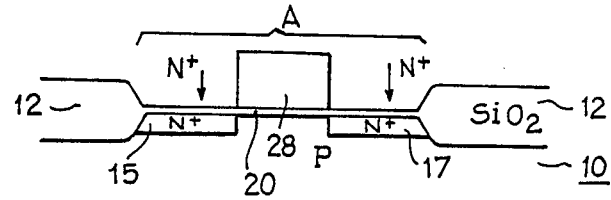
FIGS. 2 to 8 illustrate the successive fabrication steps required in order to obtain the final structure shown in FIG. 1.

FIG. 2 illustrates the substrate 10 which may be p-type, which has a resistivity of approximately 20 ohms/cm, and on which there has been formed a thick wall 12 of silicon oxide surrounding an active zone A.

There is formed in this active zone A a thin insulating layer 20 such as, for example, a silicon oxide layer obtained by thermal oxidation. The thickness can be a few hundred Angstroms or less (200 Angströms, for example).

A deposit of photosensitive resin 28 is then formed and photoetched with a mask for defining a first pattern such that the resin remains above a zone of slightly greater width than the future gate of the transistor. The width in excess is chosen so as to ensure that this first pattern covers the future gate pattern in a wholly reliable manner (taking into account the positioning tolerances of successive masks).

The resin chosen should be capable of serving as a mask for protecting the silicon during the following step of implantation of impurities.

In the next stage of the process, ion implantation of impurities (phosphorus) is carried out with a view to doping the source and drain regions on each side of the resin 28. It should be noted that this operation of deposition of a resin and implantation could also be performed at the end of the process.

There is thus formed a portion 15 of source region and a portion 17 of drain region which will have to be completed in the direction of the gate in order to form the self-aligned regions 14 and 16 of FIG. 1.

Figure 3:
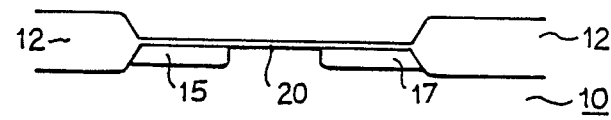
Figure 4:
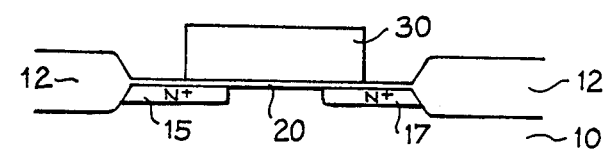

The next operation consists in removing the resin 28 (as shown in FIG. 3). A new layer of resin 30 is deposited and etched so as to form a second pattern such that the resin 30 remains above a zone of greater width than the zone corresponding to the first pattern. In more precise terms, the resin is primarily removed in the active zone A in proximity to the thick walls 12 with a view to baring the thin insulating layer 20 above a portion of the region 15 and above a portion of the region 17. These bared zones will define the source and drain contacts. Said zones must be of sufficient size to establish a good electric contact while being necessarily located at a sufficient distance from the future channel as will become apparent from the following description of the remainder of the process.

The thin oxide 20 is then removed at locations in which this latter is not protected by the resin. This operation is followed by removal of the resin. It will be noted that the resin 30 can be deposited in a layer of much smaller thickness than the resin 28 since it does not serve in principle as an implantation mask but only to provide protection during etching of the thin oxide 20.

Figure 5:
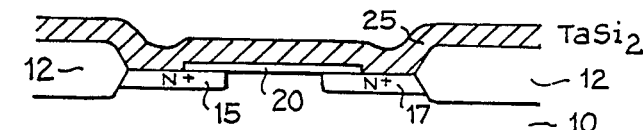

A layer of metallic silicide preferably consisting of tantalum silicide $TaSi_2$ is then uniformly deposited over the entire surface of the substrate. This deposition is performed by cathode sputtering from a target of sintered tantalum silicide. The resultant silicide layer 25 can have a thickness of a few thousand Angströms such as 2000 Angströms, for example (this step being shown in FIG. 5).

In the active zone A, the silicide layer rests directly on the monocrystalline silicon and on the thin insulating layer 20 wherever it is present, that is to say on a strip which extends throughout the active zone A.

Uniform deposition of a photosensitive resin layer 32 is then performed. This resin can consist in particular of a three-layer structure which has now come into standard use. After development, this resin has the property of affording resistance to the compounds employed for etching metallic silicide. Another property of the resin (after development) lies in its ability to absorb without allowing further penetration of the ion implantation impurities (phosphorus in particular) which are employed for formation of the source and drain regions.

By way of example, the resin 32 consists of three superposed layers as follows:

a thick base resin (having a thickness of approximately 2 microns) annealed at 200° C. (the so-called novolac resin);

a mineral thin film (titanium oxide or silicon oxide having a thickness of 1000 Angströms);

a photosensitive resin proper consisting of a thin film of novolac resin having a thickness of 5000 Angströms, for example.

Figure 6:
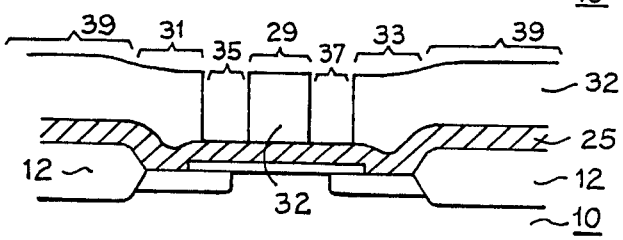

The three-layer resin thus deposited is photoetched so as to define a pattern of zones which protect the metallic silicide, the silicide being bared outside the pattern after development of the resin (as shown in FIG. 6). The photoetching operation is performed in accordance with the following procedure:

exposure through a mask;

photographic development of the resin in a thin film;

reactive-ion etching of the thin mineral layer ($CHF_3$ plasma);

reactive-ion etching of the thick resin (oxygen plasma).

The silicide pattern protected by the resin comprises:

the MOS transistor gates;

the source electrodes;

the drain electrodes;

interconnections between integrated circuit elements.

It is clearly conceivable that certain transistors may not have drain or source electrodes if, for example, the sources of a number of transistors are constituted by a single diffused source line. Consideration will be given here only to the general case in which both a source electrode and a drain electrode are present.

More specifically, the developed resin pattern 32 is made up of several parts:

the resin pattern 29 corresponding to protection of the gate electrode is formed exclusively above the thin insulating layer 20;

the resin pattern 31, 33 corresponding to protection of the source electrode (or drain electrode) covers the metallic silicide portions which are in contact with the monocrystalline silicon of the active zone and is completely separated from the pattern 29 (corresponding to the gate) by an interval (designated by the reference 35 on the source side and by the reference 37 on the drain side). The silicide is bared within this interval which extends along the gate pattern 29 on each side of this latter;

the resin pattern 39 corresponding to the interconnections extends over the thick oxide zones and may be joined to the other patterns according to the configuration of interconnections to be formed.

The next step consists in etching tantalum silicide which is removed at locations in which it is not protected by the resin 32 (vertical anisotropic etching such as, for example, plasma etching of a fluorinated or chlorinated compound $SF_6$). The etching operation is stopped when the insulating thin film 20 has been bared.

It will be noted that the values chosen for the width of the intervals 35 and 37 in which no resin is present are as small as possible. To return to an earlier stage of the process, a point worthy of note is that it proved necessary in the case of the second resin pattern 30 to choose a sufficient width to include the region 29, the regions 35 and 37 in addition to a small supplementary margin for ensuring that the intervals 35 and 37 are located above the thin oxide with a reliable degree of certainty, taking into account the positioning tolerances of successive masks.

Figure 7:
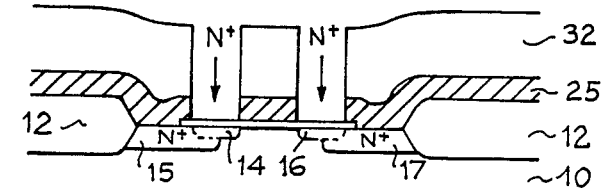

The following operation involves ion implantation of impurities (phosphorus) with a view to doping the source and drain regions at the ends nearest the gate whilst the resin 32 remains in place (as shown in FIG. 7).

Self-aligned ends 14 and 16 of the source and drain regions are thus formed on each side of the gate. Self-alignment is achieved since the same photoetching mask defines both the edge of the gates (etching of the silicide) and the edge of the source and drain region (implantation).

Under the usual conditions, it may be found that the source region and the drain region project to a slight extent beneath the gate in the lateral direction. This lateral projection is formed during the high-temperature operations which follow the implantation step and in particular during the conventional annealing operation which is carried out in a subsequent step after removal of the resin in order to restore the monocrystalline structure which may have been damaged by the implantation process.

Figure 8:
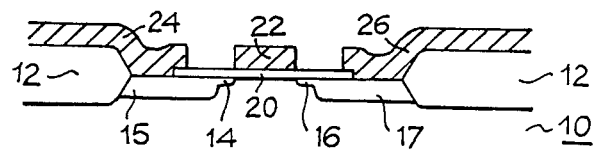

If the resin 32 is removed at this stage (as shown in FIG. 8), this results in the same structure as in FIG. 1, in which a source electrode 24 is brought into contact with the source region and a drain electrode 26 is similarly brought into contact with the drain region. The gate is designated by the reference 22.

In an alternative procedure, the masking and implantation steps explained with reference to FIG. 2 are not performed at the outset but at the end of the process after removal of the resin 32. In this case, implantation of the regions 15 and 17 is performed at higher energy through the silicide of the source and drain electrodes (the gate being protected by a resin pattern 28 which is identical with the pattern shown in FIG. 2).

The invention is also applicable to the CMOS technology in which the silicide located in proximity to the n-channel transistors is not etched at the same time as the silicide located in proximity to the p-channel transistors but two etching operations are performed, each operation being followed by a source and drain implantation.

What is claimed is:

1. A method of fabrication of an integrated circuit, wherein said method comprises the following successive steps:

(a) formation of an insulating thin film constituting the gate insulator of a field-effect transistor on a substrate of monocrystalline silicon of a first conductivity type in an active zone of said substrate;

(b) etching of the insulating layer with a view to baring the monocrystalline silicon in source and drain electrical contact zones between source and drain regions and corresponding electrodes;

(c) uniform deposition of a metallic silicide over the entire substrate so that the silicide rests on the gate insulatr at locations in which said insulator is present and comes into direct contact with the monocrystalline silicon on the remainder of the active zone;

(d) deposition of a photosensitive layer which is capable of affording resistance to the silicide etching products and of serving as a mask for stopping impurities at the time of an operation involving implantation of impurities;

(e) photoetching of the photosensitive layer in order to form a resin pattern comprising a portion of resin above the gate insulator, said portion being intended to correspond to the pattern of the gate to be formed, and portions of resin defining a source electrode, a drain electrode and interconnections, the resin being removed along the edges of the gate above the active zone and permitted to remain above the silicide in portions of active zone in which the silicon;

(f) removal of the silicide by etching at locations in which it is not protected by the resin;

(g) ion implantation of impurities in order to define source and drain regions;

(h) removal of the resin;

(i) annealing of the substrate.

2. A method according to claim 1, wherein a layer of photosensitive resin is deposited before step (b) and etched so that said layer remains in a zone which completely covers the gate pattern and projects to a slight extent on each side of said pattern, and ion implantation of impurities of a conductivity type opposite to that of the substrate is then performed.

3. A method according to claim 2, wherein the layer of photosensitive resin is deposited after the step (h) and etched so that said layer remains in a zone which completely covers the gate pattern and projects to a slight extent on each side of said pattern, and ion implantation of impurities of a conductivity type opposite to that of the substrate is then performed in the substrate through the silicide.

* * * * *